US011855184B2

(12) United States Patent
Kang et al.

(10) Patent No.: US 11,855,184 B2
(45) Date of Patent: Dec. 26, 2023

(54) METHOD OF MANUFACTURING A POWER SEMICONDUCTOR DEVICE HAVING SOURCE REGION AND BODY CONTACT REGION FORMED BETWEEN TRENCH-TYPE GATE ELECTRODES

(71) Applicant: Magnachip Semiconductor, Ltd., Cheongju-si (KR)

(72) Inventors: Soo Chang Kang, Seoul (KR); Seong Jo Hong, Bucheon-si (KR)

(73) Assignee: MagnaChip Semiconductor, Ltd., Cheongju-si (KR)

(*) Notice: Subject to any disclaimer, the term of this patent is extended or adjusted under 35 U.S.C. 154(b) by 99 days.

(21) Appl. No.: 17/337,596

(22) Filed: Jun. 3, 2021

(65) Prior Publication Data

US 2021/0288165 A1    Sep. 16, 2021

Related U.S. Application Data

(62) Division of application No. 15/790,484, filed on Oct. 23, 2017, now Pat. No. 11,056,575.

(30) Foreign Application Priority Data

Feb. 3, 2017    (KR) .......................... 10-2017-0015664

(51) Int. Cl.
*H01L 29/66*    (2006.01)
*H01L 29/06*    (2006.01)
(Continued)

(52) U.S. Cl.
CPC .. *H01L 29/66734* (2013.01); *H01L 21/76897* (2013.01); *H01L 27/0255* (2013.01);
(Continued)

(58) Field of Classification Search
CPC ......... H01L 29/66734; H01L 21/76897; H01L 29/0696; H01L 29/0865; H01L 29/1095;
(Continued)

(56) References Cited

U.S. PATENT DOCUMENTS 6,737,704 B1    5/2004    Takemori et al.
7,372,088 B2    5/2008    Miyata et al.
(Continued)

FOREIGN PATENT DOCUMENTS

KR    10-2006-0036393 A    4/2006
KR    10-2010-0079012 A    7/2010

*Primary Examiner* — Xia L Cross
(74) *Attorney, Agent, or Firm* — NSIP Law

(57) ABSTRACT

A method for manufacturing a power semiconductor device includes forming a drift region in a substrate, forming a trench in the drift region, forming a gate insulating layer in the trench, depositing a conductive material on the substrate, forming a gate electrode in the trench, forming a body region in the substrate, forming a highly doped source region in the body region, forming an insulating layer that covers the gate electrode, etching the insulating layer to open the body region, implanting a dopant into a portion of the body region to form a highly doped body contact region, so that the highly doped source region and the highly doped body contact region are alternately formed in the body region; and forming a source electrode on the highly doped body contact region and the highly doped source region.

10 Claims, 12 Drawing Sheets

(51) Int. Cl.
  *H01L 29/08* (2006.01)
  *H01L 29/10* (2006.01)
  *H01L 29/78* (2006.01)
  *H01L 21/768* (2006.01)
  *H01L 29/417* (2006.01)
  *H01L 27/02* (2006.01)
  *H01L 21/266* (2006.01)
  *H01L 29/739* (2006.01)
  *H01L 29/866* (2006.01)

(52) U.S. Cl.
  CPC ...... *H01L 29/0696* (2013.01); *H01L 29/0865* (2013.01); *H01L 29/1095* (2013.01); *H01L 29/41741* (2013.01); *H01L 29/7808* (2013.01); *H01L 29/7813* (2013.01); *H01L 21/266* (2013.01); *H01L 29/7397* (2013.01); *H01L 29/866* (2013.01)

(58) Field of Classification Search
  CPC ........... H01L 29/41471; H01L 29/7808; H01L 29/7813; H01L 29/7397
  USPC ........................................................ 257/334
  See application file for complete search history.

(56) References Cited

U.S. PATENT DOCUMENTS

| | | |
|---|---|---|
| 2002/0125528 A1 | 9/2002 | Kawaguchi et al. |
| 2005/0035402 A1 | 2/2005 | Venkatraman |
| 2008/0116520 A1 | 5/2008 | Grover |
| 2010/0176446 A1 | 7/2010 | Hsieh |
| 2013/0092976 A1* | 4/2013 | Hsieh .................. H01L 27/0629 257/133 |
| 2013/0200451 A1* | 8/2013 | Yilmaz ................. H01L 29/086 438/270 |
| 2015/0349091 A1* | 12/2015 | Yilmaz ........... H01L 21/823487 438/270 |

* cited by examiner

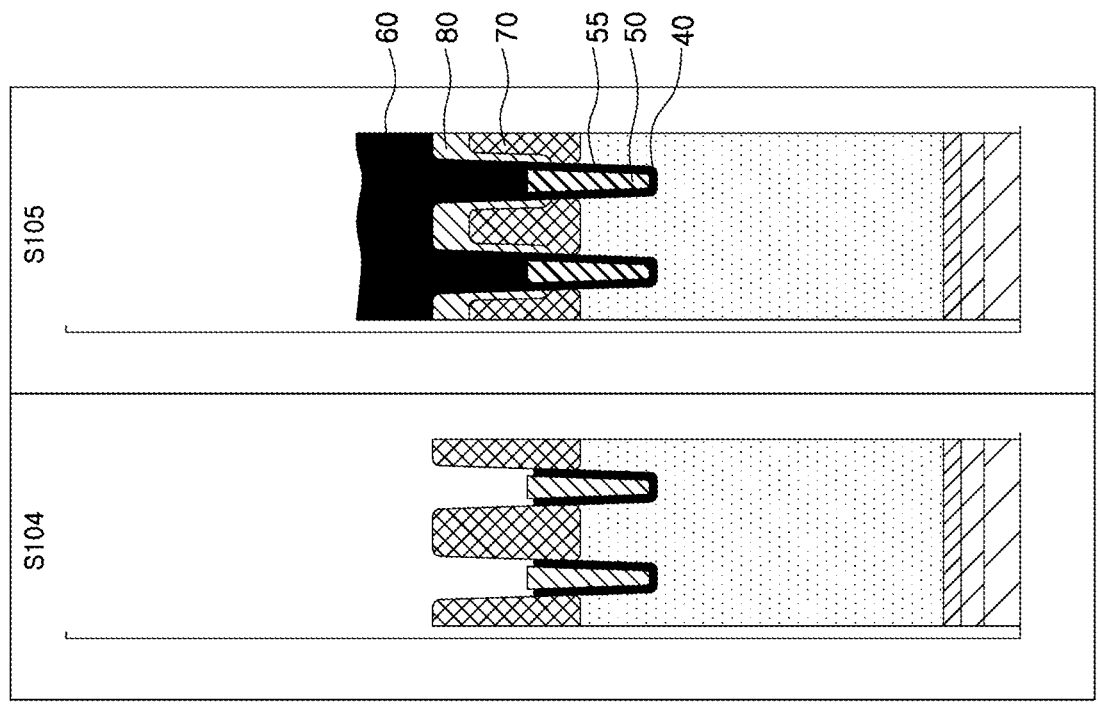
FIG. 7
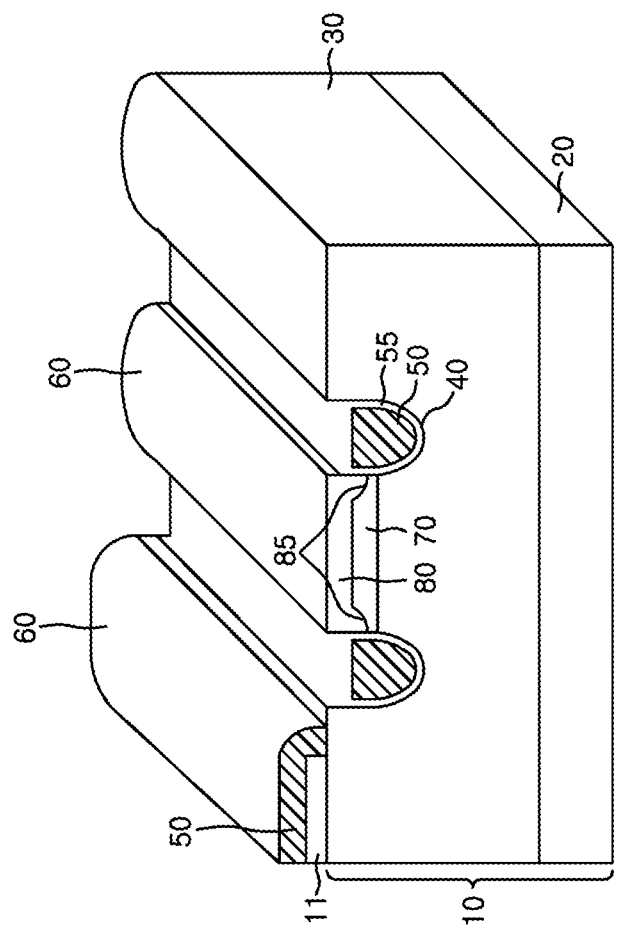

(a)

(b)

(c)

METHOD OF MANUFACTURING A POWER SEMICONDUCTOR DEVICE HAVING SOURCE REGION AND BODY CONTACT REGION FORMED BETWEEN TRENCH-TYPE GATE ELECTRODES

CROSS-REFERENCE TO RELATED APPLICATIONS

This application is a division of application Ser. No. 15/790,484 filed on Oct. 23, 3017, which claims the benefit under 35 USC 119(a) of Korean Patent Application No. 10-2017-0015664 filed on Feb. 3, 2017, in the Korean Intellectual Property Office, the entire disclosure of which is incorporated herein by reference for all purposes.

BACKGROUND

1. Field

The following description relates to a power semiconductor device. The following description also relates to a manufacturing method of such a power semiconductor device. Additionally, the following description relates, to a power semiconductor device including a source and a body contact region formed alternately. The following description also relates to a manufacturing method of such a power semiconductor device.

2. Description of Related Art

In a conventional trench Metal-Oxide-Semiconductor Field-Effect Transistor (MOSFET), a method of forming a source metal by etching a part of a substrate is used for a contact forming method. Such a method is referred to as contact recess etching. Such an approach is able to operate the device stably, but has limitations in reducing the cell pitch for the device. Other methods of contact formation include self-alignment, but such manufacturing methods are complex.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method for manufacturing a power semiconductor device includes forming a drift region of a first conductivity type in a substrate, forming a trench in the drift region, forming a gate insulating layer in the trench, depositing a conductive material on the substrate, forming a gate electrode in the trench, forming a body region in the substrate, forming a highly doped source region of the first conductivity type in the body region, forming an insulating layer that covers the gate electrode, etching the insulating layer to open the body region, implanting a dopant of a second conductivity type into a portion of the body region to form a highly doped body contact region of the second conductivity type, so that the highly doped source region and the highly doped body contact region are alternately formed in the body region, and forming a source electrode on the highly doped body contact region and the highly doped source region, wherein the forming of the highly doped source region is performed to start from an upper surface of the substrate and to extend along a sidewall of the trench to overlap with the gate electrode.

A top surface of the gate electrode may be located at a position higher than half of a depth of the trench.

The highly doped source region may include a first portion adjacent to the upper surface of the substrate and a second portion adjacent to the sidewall of the trench, and a depth of the second portion may be a deeper depth than a depth of the first portion with respect to the upper surface of the substrate.

The depositing of the conductive material may include depositing the conductive material on the gate insulating layer and a portion of the substrate, and the method may further include forming a Zener diode in the conductive material deposited on the portion of the substrate.

The forming of the Zener diode may include implanting second conductivity type ions into the conductive material, forming a mask pattern on the conductive material, implanting first conductivity type ions into the conductive material through the mask pattern, and removing the mask pattern The method may further include forming a thick oxide layer on the portion of the substrate, wherein the depositing of the conductive material includes depositing the conductive material on the gate insulating layer and the thick oxide layer, and the forming of the Zener diode may include forming the Zener diode in the conductive material deposited on the thick oxide layer.

The method may further include forming a gate pad connected to the gate electrode, wherein the Zener diode is connected to the gate pad and the source electrode.

The Zener diode may include a number of rings depending on a breakdown voltage of the power semiconductor device.

The substrate may include a drain region and the drift region may be an epi-layer doped with a lower concentration than the drain region.

An area of the highly doped source region may be larger than an area of the highly doped body contact region.

In another general aspect, a power semiconductor device includes a drift region formed in a substrate, a trench formed in the drift region, a gate insulating layer and a gate electrode formed in the trench, a conductive material formed on the substrate, a body region formed in the substrate, a highly doped source region and a highly doped body contact region formed alternately in the body region, an insulating layer formed on the gate electrode, and a source electrode formed on the substrate, wherein the highly doped source region starts from an upper surface of the substrate and extends along a sidewall of the trench to overlap with the gate electrode.

The highly doped source region may include a first portion adjacent to the upper surface of the substrate and a second portion adjacent to the sidewall of the trench, and a depth of the second portion may be a deeper depth than a depth of the first portion with respect to the upper surface of the substrate.

The power semiconductor device may further include a Zener diode formed in the conductive material.

The power semiconductor device may further include a gate pad connected to the gate electrode, wherein the Zener diode is connected to the gate pad and the source electrode.

The Zener diode may include a number of rings depending on a breakdown voltage of the power semiconductor device.

An area of the highly doped source region may be larger than an area of the highly doped body contact region.

The substrate may include a drain region and the drift region may be an epi-layer doped with a lower concentration than the drain region.

Other features and aspects will be apparent from the following detailed description, the drawings, and the claims.

BRIEF DESCRIPTION OF THE DRAWINGS

FIGS. 5 to 8 are drawings illustrating the cross-sectional views of a power semiconductor device according to each process of the example of FIG. 4.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1A:
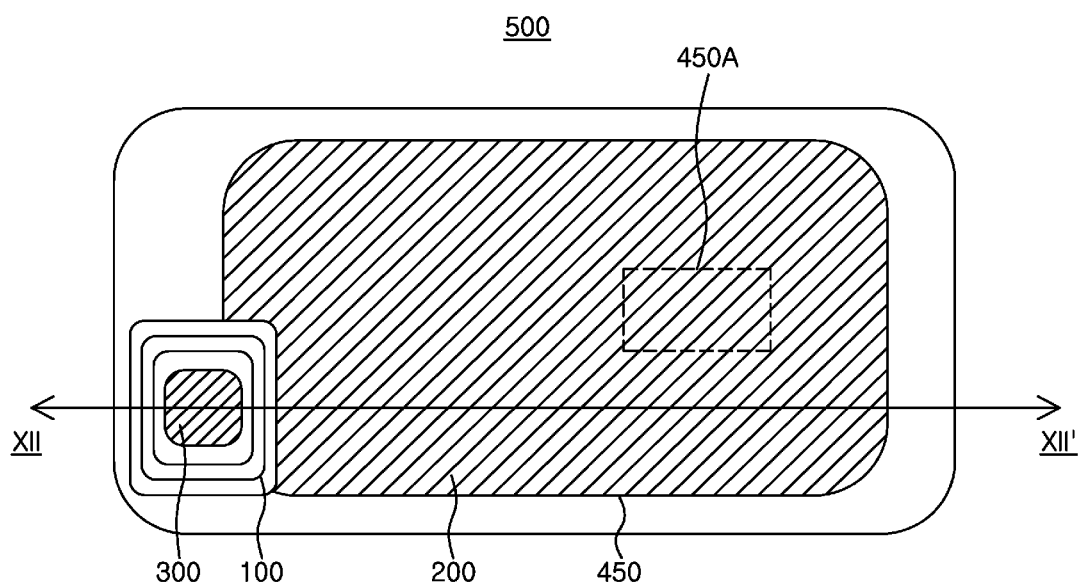
FIG. 1A is a plan view of a power semiconductor device according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

Further, in describing the constituent elements of the present disclosure, the same reference numerals may be given to constituent elements having the same name, and the same reference numerals may be given to different drawings. However, even in such a case, it does not mean that the corresponding components have different functions according to the embodiments, or that they have the same functions in different embodiments, and the functions of the respective components should be understood based on the description corresponding to each component of the embodiments.

There is a potential benefit for providing a method of forming a simplified contact, while at the same time reducing the cell pitch and while also operating the device stably in such a trench MOSFET device.

Examples seek to provide a simplified method of manufacturing a contact while at the same time reducing the cell pitch while operating the power semiconductor device stably.

Examples simplify the manufacturing process because a contact recess etching is unnecessary. It is possible to form a source region and a body contact region which are alternately formed on the substrate surface. Also, since the substrate etching process is eliminated, the cell pitch may be reduced because the space is secured accordingly.

Further, examples include a Zener diode formed so that the device may be stably operated.

Further, examples also reduce the drain-source on-state resistance Rdson characteristic while reducing the channel length. That is, starting from the upper surface of the substrate, it is possible to form a highly doped source region so as to extend along the sidewalls of the trench and overlap with the gate electrode.

FIG. 1A is a plan view of a power semiconductor device 500 according to an example.

The power semiconductor device according to the example of FIG. 1A has a structure including several hundred or more trench MOSFETs. The region including such a trench MOSFET structure is referred to as an active cell region 450, which occupies the largest area of the power semiconductor device 500 as shown in the example of FIG. 1A. In the active cell region 450, there are a highly doped source region and a highly doped body contact region, and also an emitter electrode or a source electrode 200 electrically connected to the source region. The body contact region is located over the active cell region 450. Additionally, a gate pad 300, electrically connected to the gate electrode disposed in the trench MOSFET structure, is located at the lower corner. The source electrode 200 and the gate pad 300 are both formed of a metal material and are formed apart from each other. A variety of metal materials with appropriate conductive properties may be used to form the source electrode 200 and the gate pad 300. Additionally, the power semiconductor device 500 includes a Zener diode 100. The Zener diode 100 is located between the source electrode 200 and the gate pad 300. Additionally, the Zener diode 100 is interconnected as to surround the rim of the gate pad 300. Thus, the Zener diode 100 is formed in a form of two or three rings. The number of rings may vary depending on the breakdown voltage of the power semiconductor, so as to have appropriate electrical properties for the structure in which the Zener diode 100 is included.

Figure 1B:
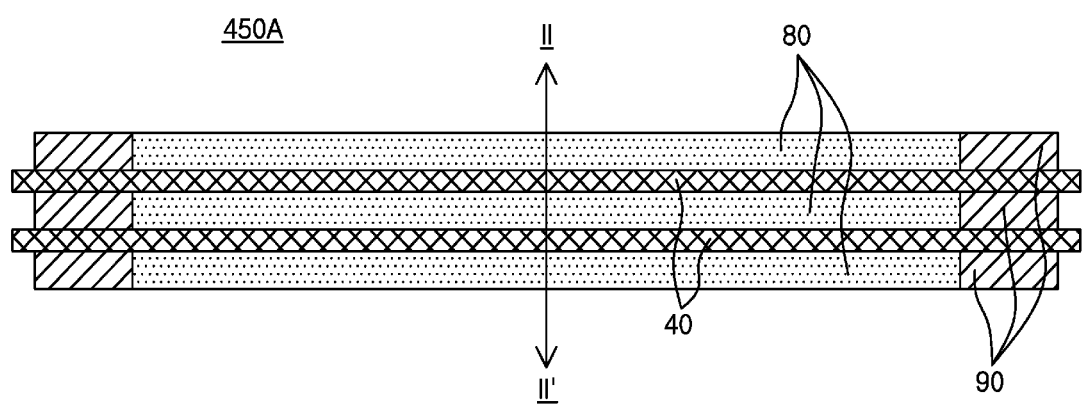
FIG. 1B is an enlarged view of a portion of the active cell region of the power semiconductor device shown in the example of FIG. 1A.

FIG. 1B is an enlarged view of a portion 450A of the active cell region 450 of the power semiconductor device shown in the example of FIG. 1A.

As illustrated in the example of FIG. 1B, the power semiconductor device 500 according to an example includes trenches 40, highly doped source regions 80 having a first conductivity type N, and highly doped body contact region 90 having a second conductivity type P. The highly doped source regions 80 and the highly doped body contact regions 90 are collectively referred to as active regions 80, 90. The active regions 80, 90 are formed between the trenches 40, the width of which active regions 80, 90 is greater than the width of the trenches 40 when viewed in the Y-Y direction. A larger width for the active regions 80, 90 is required because such a width is necessary to act as the passage through which the electron or hole carriers move in the active regions 80, 90.

In the example of FIG. 1B, the source region 80 and the body contact region 90 are formed alternately. For example, the highly doped body contact region 90 is formed by implanting ions of the second conductivity type P at a high concentration next to the highly doped source region 80. Accordingly, highly doped body contact region 90 is formed alternately next to the highly doped source region 80. In this manner, the highly doped source region 80 and the highly doped body contact region 90 are each formed in a repeated pattern structure, as explained above. Thus, a ladder-like pattern structure is formed in this manner, in which the highly doped source region 80 and the highly doped body contact region 90 are sequentially repeated.

A reason why the area of the source region 80 is much larger than the area of the body contact region 90 is to allow more current to flow. Because electrons are mainly supplied through the source region 80, the area is enlarged accordingly in order to permit the flow of more charge carriers. The example of FIG. 1B only shows a part of the active cell region corresponding to the example of FIG. 1A at 450. Such patterns are repeated a number of times to form a complete trench MOSFET.

Figure 2:
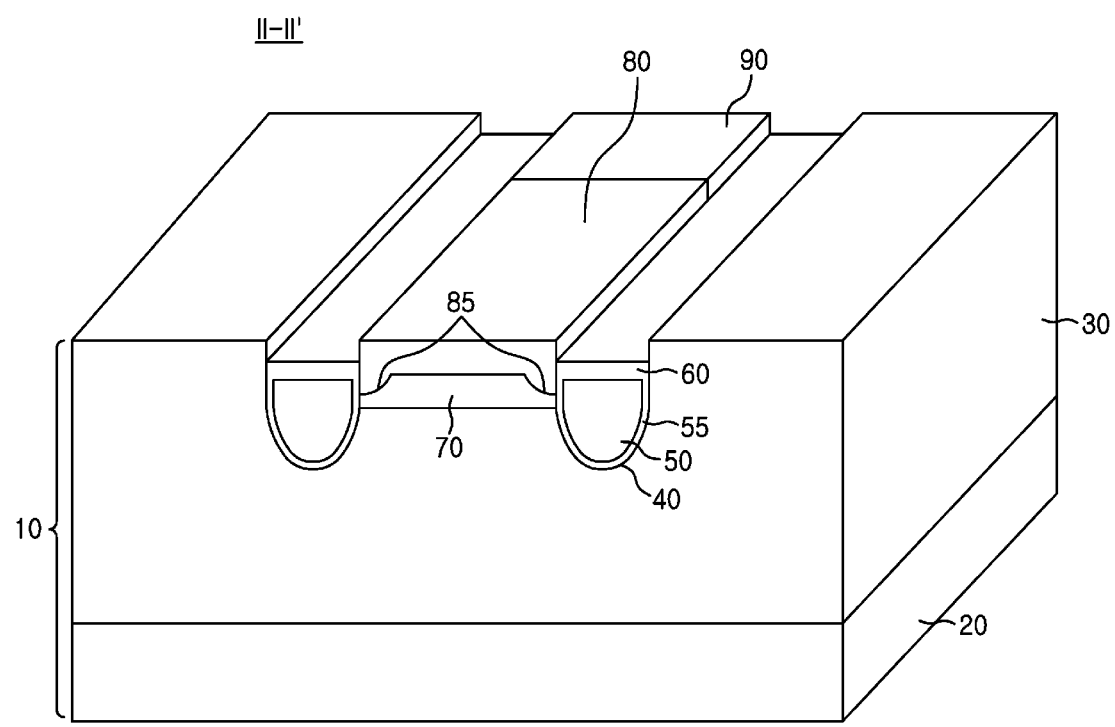
FIG. 2 is a cross-sectional view of a power semiconductor device according to an example taken along the line II-II' in FIG. 1B.
Figure 3:
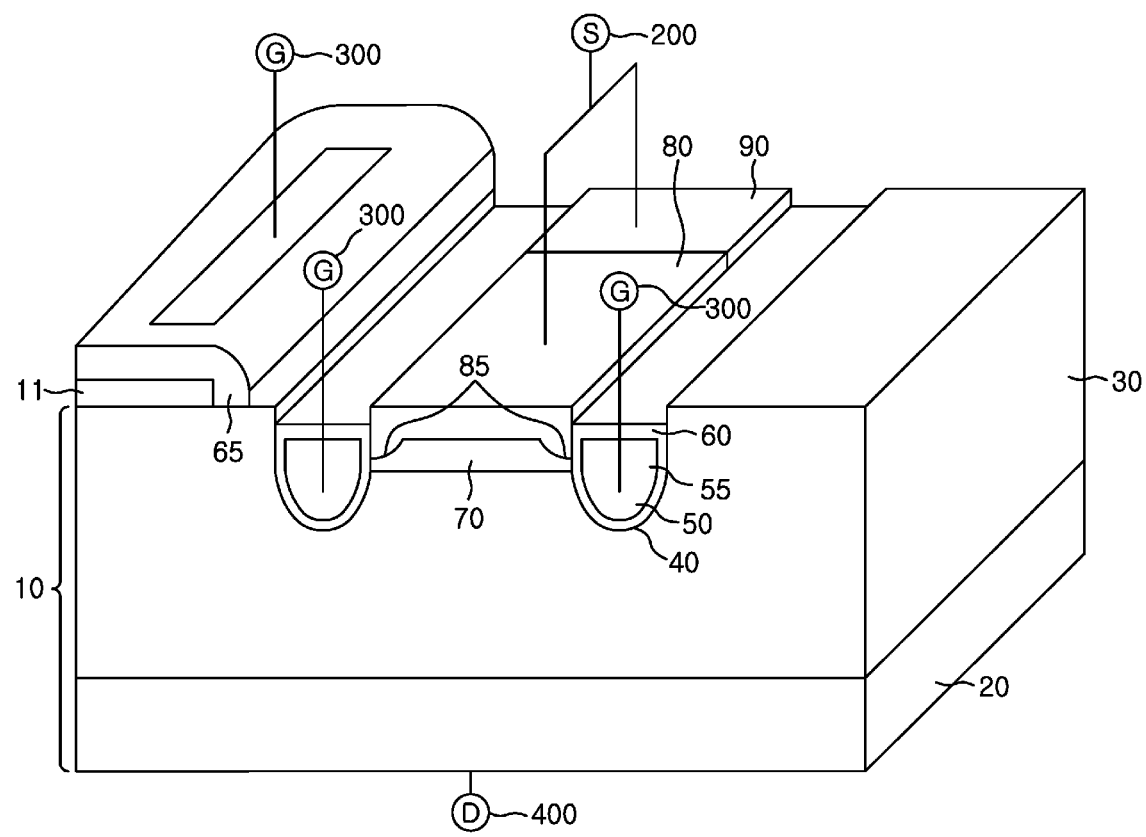
FIG. 3 is a drawing illustrating a structure of an operation of a power semiconductor device according to an example.

FIG. 2 is a cross-sectional view of a power semiconductor device according to an example taken along the line II-II' in FIG. 1B. FIG. 3 is a drawing illustrating a structure of an operation of a power semiconductor device with a trench MOSFET according to an example.

As illustrated in the example of FIG. 2, a power semiconductor device according to an example includes a substrate 10, a drift region 30, trenches 40, a gate insulating layer 55, a gate electrode 50 of conductive material, a lowly doped body region 70, a highly doped source region 80, a highly doped source edge region 85, a highly doped body contact region 90, an insulating layer 60 and a source electrode 200 as shown in FIGS. 2-3. In such an example, the power semiconductor device potentially further includes a gate pad 300 and a drain electrode 400, such as shown in FIG. 3.

Subsequently, each component of the power semiconductor device according to the example of FIG. 2 is described in further detail.

In an example, the substrate 10 may be an epi-layer or a Si-substrate. However, these are only examples, and the substrate may include other materials in other examples. The drain region 20 is formed at the bottom side of the substrate 10. For example, the drain region 20 may be a highly doped N-type drain region. Furthermore, an N-type drift region 30 is formed on the substrate 10. In such an example, the drift region 30 is an epi-layer deposited by an epitaxial method. Because the drift region is required to withstand high voltages, an epi-layer doped with a lower concentration than the drain region is used in the drift region.

In order to form a trench MOSFET structure, trenches 40 are formed on the drift region 30. Additionally, an active region is formed between the trenches 40. A gate insulating layer 55 and a gate electrode 50 are formed in the trenches 40. A conductive material such as polysilicon is deposited on the gated insulating layer 55. This conductive material is etched back to form the gate electrode 50 in the trenches 40. Also, the gate electrode 50 is formed on the gate insulating layer 55.

The lowly doped P-type body region 70 is formed in the active region and serves as a channel region. Furthermore, the highly doped source region 80 and the highly doped body contact region 90 are alternately formed on the body region 70. In such an example, the highly doped source region 80 further includes a highly doped source edge region 85. The highly doped source edge region 85 starts from the active region and extends along the sidewall of the trenches 40. The highly doped source edge region 85 is formed to overlap with the gate electrode 50. In an example, such a highly doped source region 80 has a first depth formed on the active region and a second depth formed along the sidewall of the trenches. Also, in an example, the second depth is formed to be deeper than the first depth of the highly doped source region 80.

The highly doped source edge region 85 is caused as a result of the presence of trench slope. The deeper the trench depth, the more the trench slope increases, such as from 85 to 89 degrees. As a result, the lower portion of the highly doped source region 80 is not flat, and is formed to be deeper due to the presence of the highly doped source edge region 85 at both ends. Thus, the channel length is reduced accordingly so that the Rdson is reduced, where Rdson refers to the drain-source on resistance of the device, or the total resistance between the drain and the source in the relevant MOSFET.

In the example of FIG. 3, an insulating layer 60 is formed on the gate electrode 50 to electrically isolate the gate electrode 50 from the source electrode 200. The insulating layer 60, called Inter-Layer Dielectric (ILD), may include a Borophosphosilicate Glass (BPSG) layer and a High-temperature Low-pressure Dielectric (HLD) oxide layer. The insulating layer 60 separates the gate electrode 50 and the source electrode 200 from one another. However, these are only examples and other materials and structures may be used for the insulating layer 60, as appropriate.

The source electrode 200 is formed in the highly doped body contact region 90 and the highly doped source region 80 by using a metal material such as aluminum (Al), copper (Cu), titanium (Ti), or tungsten (W). However, these are only examples, and other metals with appropriate conductive properties are used in other examples.

Meanwhile, as illustrated in the example of FIG. 3, a power semiconductor device according to an example operates as an N-channel trench MOSFET.

First, a Turn on operation is explained. In response to a positive (+) voltage being applied to the gate pad 300 during the turn-on operation, electrons accumulate on the side surface of the trenches 40. As a result, a channel that is an inversion layer due to electrons being gathered in the lowly doped body region 70 forms. At this time, when a negative (−) voltage is applied to the source electrode and a positive (+) voltage is applied to the drain electrode 400 as much as an operating voltage, electrons injected through the source electrode pass through the highly doped source region 80. Thus, the electrons arrive at the drift region 30 through the channel of the lowly doped body region 70, and then flow to the highly doped drain region 20.

By contrast, a Turn off operation is also explained further. In response to a negative (−) voltage being applied to the gate pad 300 during the turn-off operation, the inverted channel disappears. Simultaneously, the current due to the electrons is interrupted, and thus the device no longer operates.

Figure 4:
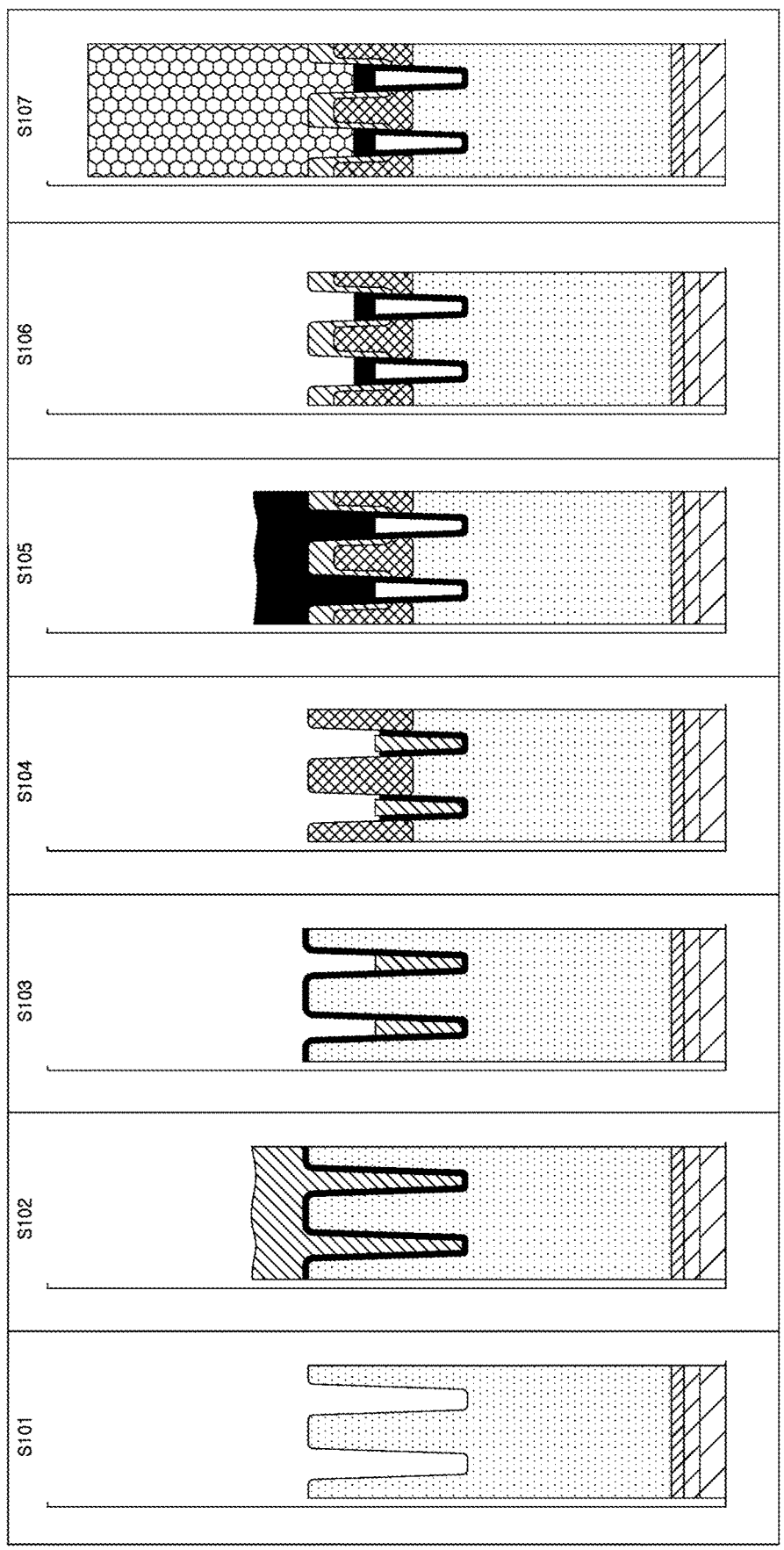
FIG. 4 is a drawing illustrating a method of manufacturing a power semiconductor device according to an example.

FIG. 4 is a drawing illustrating a method of manufacturing a power semiconductor device according to an example. Also, FIGS. 5 to 8 are drawings illustrating the cross-sectional views of a power semiconductor device according to each process of the example of FIG. 4.

As illustrated in the example of FIG. 4, a method of manufacturing a power semiconductor device according to an example is performed in accordance with steps S101 to S107 illustrated in the example of FIG. 4.

Hereinafter, referring to the examples of FIG. 4 and FIG. 5 to FIG. 8, a method of manufacturing a power semiconductor device, and a structure of such a power semiconductor device according to each process is described further.

Figure 5:
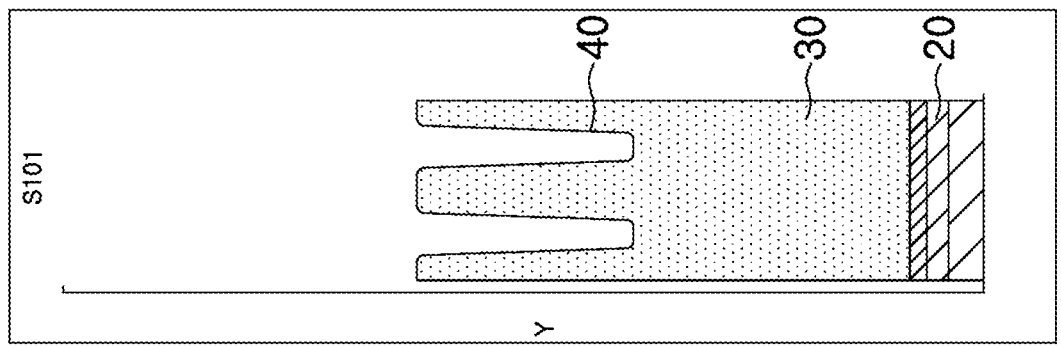
Figure 5:
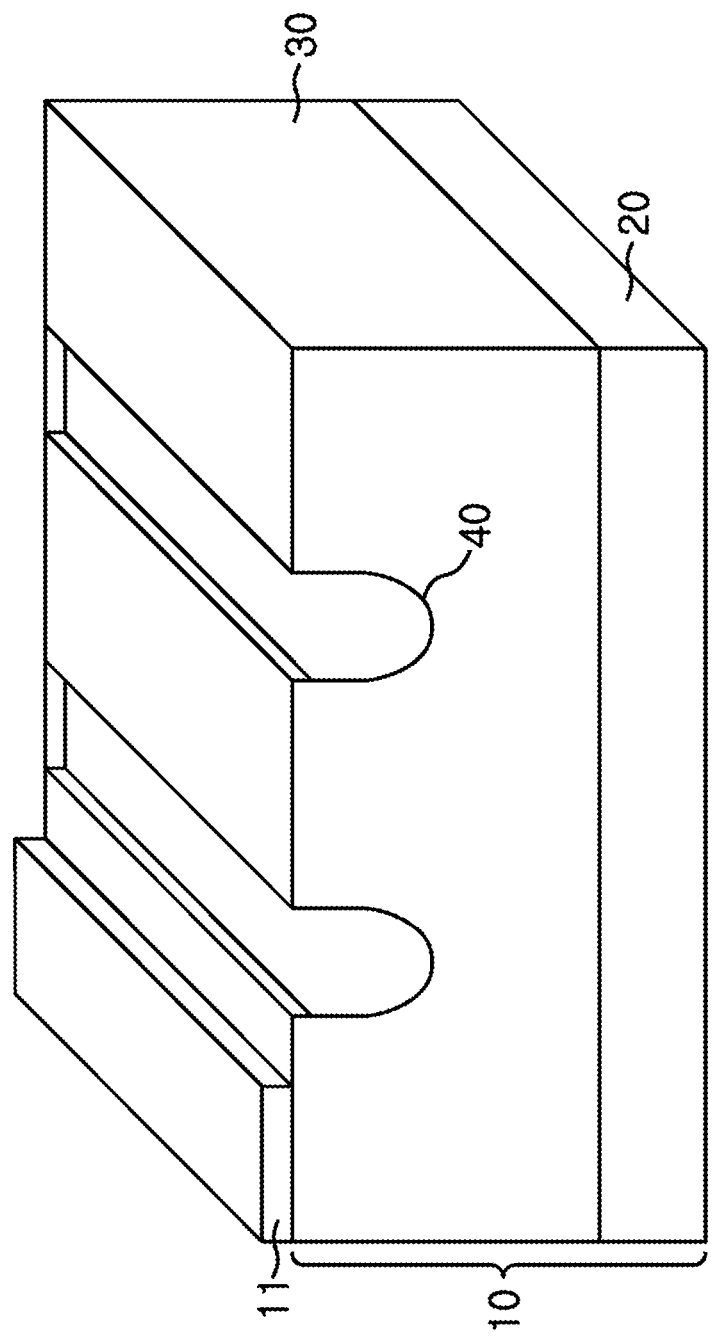

As illustrated in the example of FIG. 5, step S101 forms a drift region 30, a LOCal Oxidation of Silicon (LOCOS) type separating layer 11 and trenches 40. First, a drift region 30 of the first conductivity type is formed on the substrate 10. Such an initial substrate thickness is formed to be very thin. However, a low concentration epi-layer is thickly deposited on the initial substrate to form a thick substrate 10 including the drift region 30. The substrate may be formed by forming a thick low concentration epi-payer 30 on the thin high concentration epi-layer 20. Such a high concentration epi-layer may be used as a drain region 20. In such an example, the thick low concentration epi-layer 30 is used as a drift region.

Trenches 40 are formed on the drift region 30. In such an example, the slope of the trenches 40 is 85 to 90 degrees. Thus, trenches 40 having 1 to 3 um depth are formed by using a dry etching process. At this time, when the trenches are formed, in order to control the depths of the lowly doped body region 70 and the highly doped source region 80, the epitaxial wafer is etched to maintain the slope of the trenches at 85 to 89 degrees.

Figure 6:
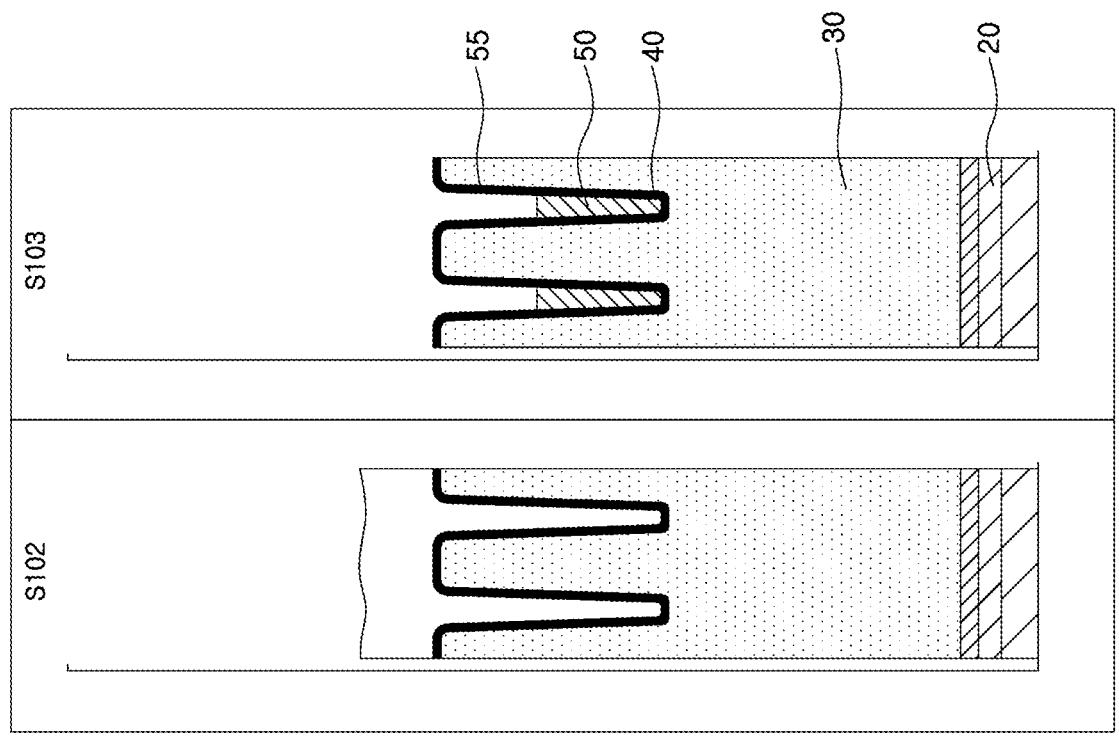
Figure 6:
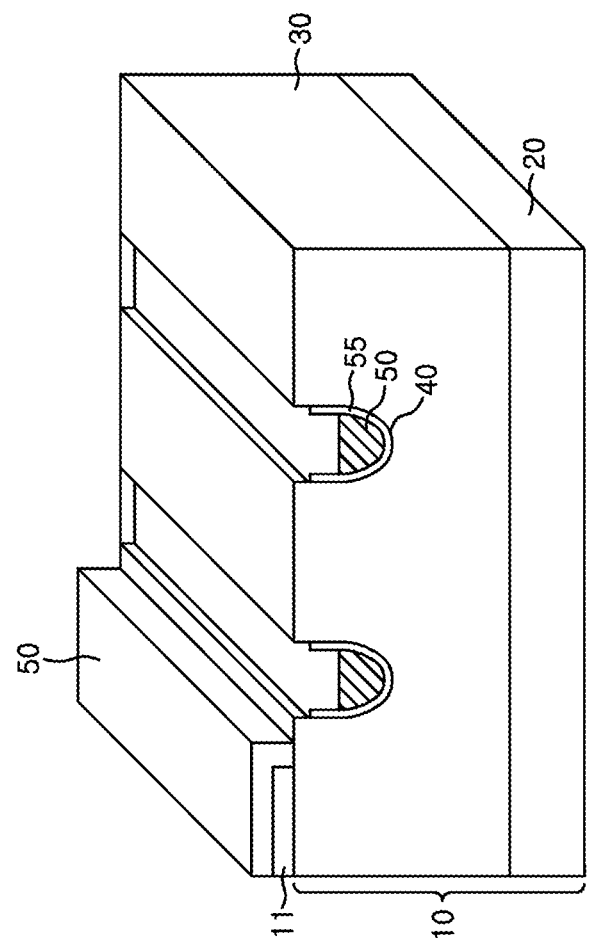

As illustrated in the example of FIG. 6, in the step S102, a gate insulating layer 55 is formed in the trenches 40. Also, a gate insulating layer 55 is formed on the sidewall of the trenches by using thermal oxidation. To form a device with a threshold voltage approximately between 1.0 to 1.2 V, a thickness of 20 to 100 nm of the gate insulating layer 55 is required. Then, a conductive material used to form the gate electrode 50 is deposited on the gate insulating layer 55.

To form the gate electrode 50, a poly-silicon material is used. At this moment, in such an example, to control the resistance of the electrode, a doped poly-silicon (doped poly-Si) or undoped poly-silicon (undoped poly-Si) is selectively formed.

Meanwhile, the step S102 includes a method of forming a Zener diode by using a poly-silicon material. A method of forming a Zener diode and a structure of such a Zener diode in a power semiconductor device is described further in FIG. 9 to FIG. 10.

Thereafter, in step S103, the conductive material used to form the gate electrode 50 deposited on the gate insulating layer 55 is etched back to form the gate electrode 50 in the trenches 40. Accordingly, for the efficiency of the power semiconductor device, the upper surface of the gate electrode 50 is located to be higher than the half the depth of the trenches 40.

In the present examples, 600 to 900 nm of height of a top portion of poly-Si is removed from the initially deposited polysilicon to leave 500 to 1000 nm in height of the gate electrode. Accordingly, the breakdown voltage, the channel depth, and the Ohmic contact value for the device are changed according to the height of the gate electrode. Therefore, in consideration of these electrical characteristics of the power semiconductor device, the height of the gate electrode is accordingly optimized.

As illustrated in the example FIG. 7, in the step S104, a lowly doped P-type body region 70 is formed on the active region.

After poly-Si etching, ion implantation on the substrate is performed to form a lowly doped body region 70. The dose and energy implanted to form a lowly doped body region 70 is adjusted according to the characteristics of the threshold voltage and Rdson.

Also, the step S105 selectively forms a highly doped source region 80 in the body region 70. To selectively form such a highly doped source region 80, an N+ mask pattern formed through such step as an N+ photo step is used. The process of forming the highly doped source region 80 starts from a top surface of the active region, extends along the sidewall of the trench 40, and overlaps with the gate electrode 50. In such an example, the highly doped source region 80 is defined as having the first depth in the active region and the second depth along the sidewall of the trenches 40. For example, the second depth of the highly doped source region 80 is formed to be deeper than the first depth. Accordingly, the highly doped source region 80 includes a first portion adjacent to the upper surface of the substrate 10 and a second portion adjacent to the sidewall of the trench 40. In an example, a depth of the second portion is a deeper depth than a depth of the first portion with respect to an upper surface of the substrate 10.

Further, in the step S105, when a source region 80 of the first conductivity type is formed, a N-type source region 80 is formed by ion implantation in the P-type body region 70 in a direction perpendicular to the top surface of substrate 10, or by ion implantation in a direction tilted by a predetermined angle that will lead to appropriate electrical characteristics as described further above.

The highly doped source region 80 is doped to extend in an elongated manner along the side surface of the trench 40 when the dopants are implanted. Such a structure forms the highly doped source region 80 to extend to the inside of the lowly doped body region 70, thereby reducing the channel length and reducing the threshold voltage. Also, such structure may reduce the Rdson characteristic. The body region 70 shrinks further if the source region extends further along the sidewall of the trenches. Accordingly, the channel length is also reduced, because the body region 70 shrinks as well.

Also, the step S105 forms an insulating layer 60 so as to cover a gate electrode 50, a highly doped source region 80, and a body contact region 90. The insulating layer 60 includes a Chemical Vapor Deposition (CVD) insulating layer. For example, such an insulating layer 60 may include HLD and BPSG portions, as discussed further, above. In such an example, the CVD insulating layer serves to prevent the boron from the BPSG portion from penetrating into the gate electrode 50 during the BPSG deposition to change the resistance. Therefore, a CVD insulating layer of the thickness about 50 to 200 nm is deposited, according to an example.

Figure 8:
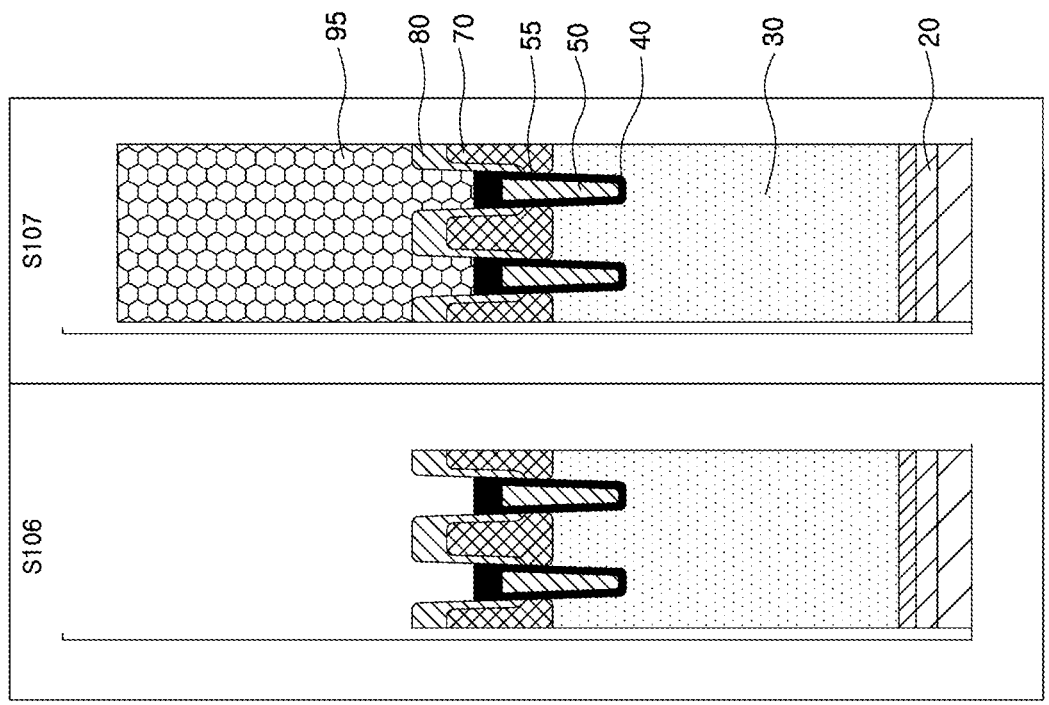
Figure 8:
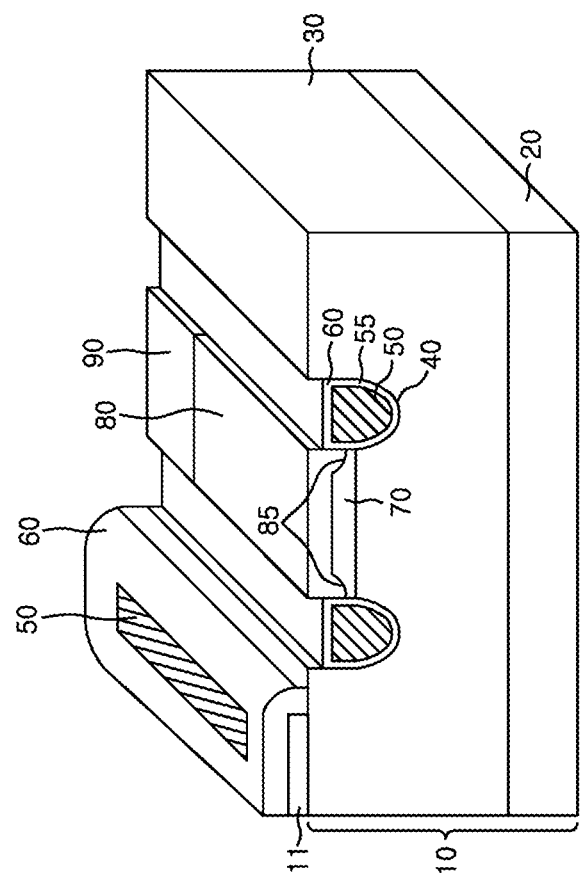

As illustrated in the example of FIG. 8, in the step S106, a first contact photo process and a contact etching process are performed to expose the highly doped source region 80 and the body region 70. The insulating layer 60 is etched to open all of the active cell regions. In such contact etching, the contact etch process utilizes a Self-Align Contact (SAC) etch process that does not require a further mask pattern. Thus, in the contact etching process according to an example, the active area is exposed even if only the first dry etching or the wet etching is performed. The source region 80 and the body region 70 are accordingly exposed at the same time. Such an approach does not require additional etching processes.

Also, to selectively form a highly doped body contact region 90, a second contact photo process step S106 is performed. Through the second contact photo process, a new mask pattern is formed. Also, a highly doped body contact region 90 is formed by ion implantation of the dopant in the lowly doped body region 70 by using the new mask pattern. The highly doped source region 80 and the highly doped body contact region 90 are alternately formed on such a lowly doped body region 70. Accordingly, a highly doped body contact region 90 is formed between the highly doped source regions 80.

Thereinafter, the step S107 forms a source electrode 200 that is electrically connected to the highly doped body contact region 90 and the highly doped source region 80. For example, titanium nitride (TiN) and aluminum (Al) are deposited to form the source electrode 200. However, these are only examples and other materials with similar properties may be deposited to form the source electrode.

A power semiconductor device is manufactured by depositing a tetraethyl orthosilicate (TEOS) layer and a silicon nitride layer (SiN) to form a passivation layer. Such a passivation layer improves soft breakdown voltage, and also blocks moisture penetration into the power semiconductor device.

Figure 9:
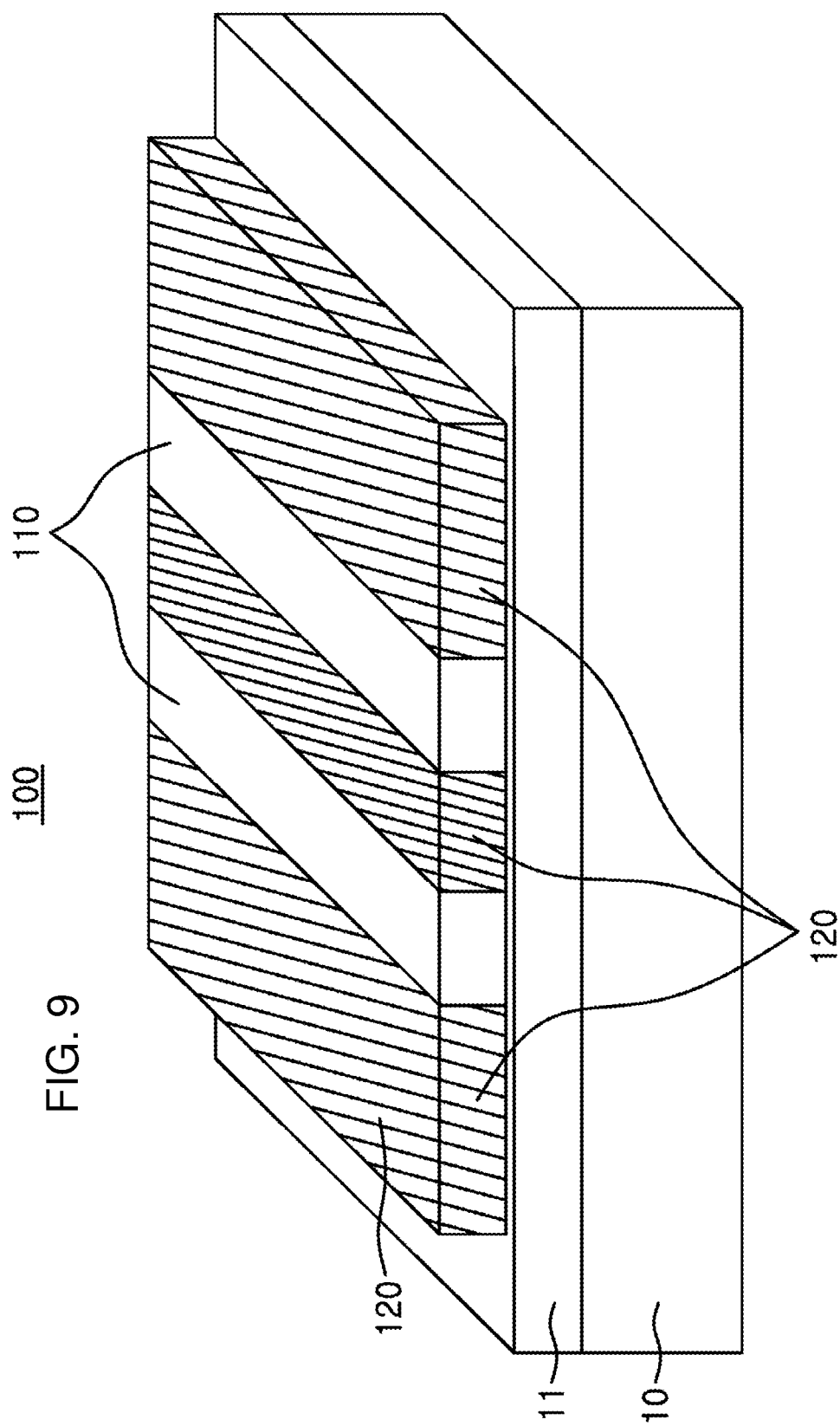
FIG. 9 is a drawing illustrating a structure of a Zener diode according to an example.

FIG. 9 is a drawing illustrating a structure of a Zener diode according to an example.

As illustrated in the example of FIG. 9, the Zener diode 100 has a structure in which NPNP layering is repeated. The high concentration N+ region 120 and the high concentration P+ region 110 are repeatedly formed. In the example of FIG. 9, the Zener diode 100 is formed by doping P type impurities and then implanting the N type impurities 120 through an ESD mask pattern 115 shown in FIG. 10.

The Zener diode 100 has a PN junction structure similar to a diode in general. However, a Zener diode 100 has a very low and constant breakdown voltage characteristics and current flows when a certain breakdown voltage or more is applied in the reverse direction. Accordingly, such a Zener breakdown phenomenon and an electron avalanche breakdown phenomenon are used as advantageous features. When the applied voltage is less than 5.6V, the Zener breakdown becomes the main characteristic, and above that, the electron avalanche breakdown phenomenon becomes the main characteristic. The Zener diode 100 is used for a purpose of protecting a circuit device from an overvoltage that would otherwise potentially cause damage. Namely, when Electrostatic Discharge (ESD) stress having high voltage or currents flows, such operation is required for the protection of the device.

Figure 10:
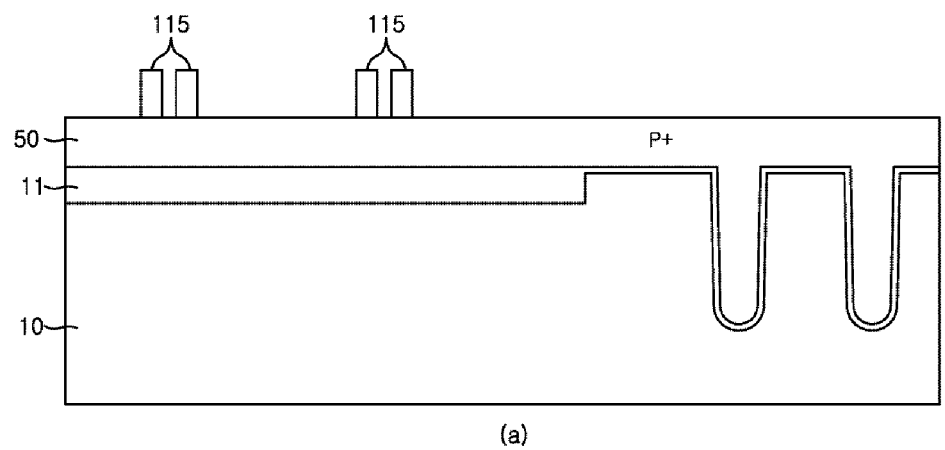
FIG. 10 is a drawing illustrating a method of manufacturing a Zener diode according to an example.
Figure 10:
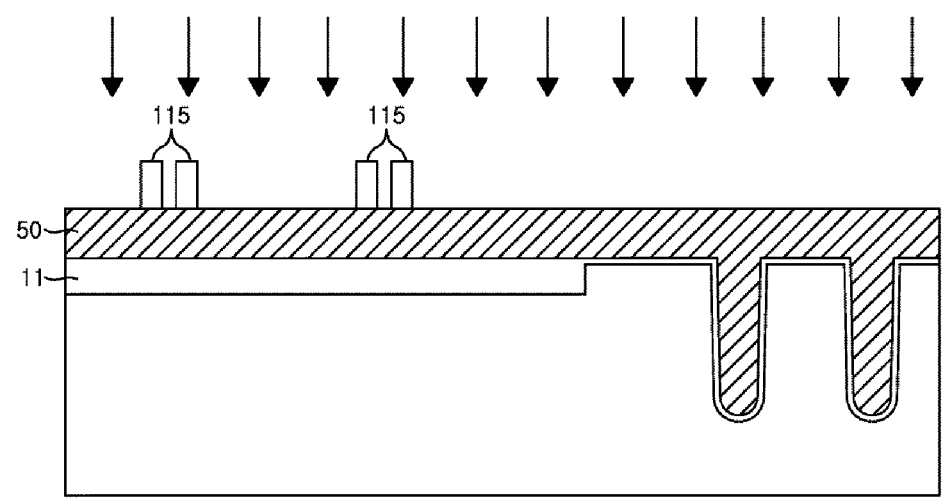
Figure 10:
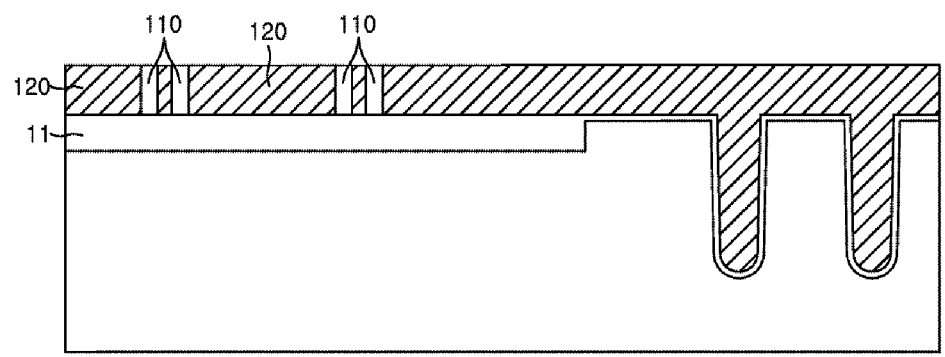

FIG. 10 is a drawing illustrating a method of manufacturing a Zener diode according to an example.

As illustrated in part (a) of FIG. 10, a thick oxide layer LOCOS 11 is formed on the substrate 10, and a conductive material used to form the gate electrode 50 such as polysilicon or metal is deposited above the thick oxide layer LOCOS 11. Polysilicon is an example of a conductive material in such an example. Polysilicon, which may be the conductive material used to form the gate electrode 50, is simultaneously deposited inside the trenches of the active cell region 450 as well. Therefore, the poly-Si used for the Zener diode 100 and the poly-Si used for the trench MOSFET are electrically connected with each other. However, even if an ESD stress is introduced, the ESD stress is designed to be cut off by the Zener diode 100 and to flow out to the source electrode 200 without introducing stress into the gate electrode 50 itself in the trenches 40. Therefore, it is possible to prevent the gate insulating layer 55 from being broken by such an ESD event. For example, the second conductivity type P ions are injected into the polysilicon used to form the gate electrode 50. Therefore, it is transformed into the polysilicon 110 doped by P+. Then, an ESD mask pattern 115 is formed on the P+ polysilicon 110. As illustrated in part (b) of FIG. 10, the first type N ions are injected into the P+ polysilicon 110. As illustrated in part (c) of FIG. 10, the P+ polysilicon 110 under the ESD mask pattern 115 is protected by the mask pattern and the remaining portion is changed to polysilicon 120 doped with N+.

Figure 11:
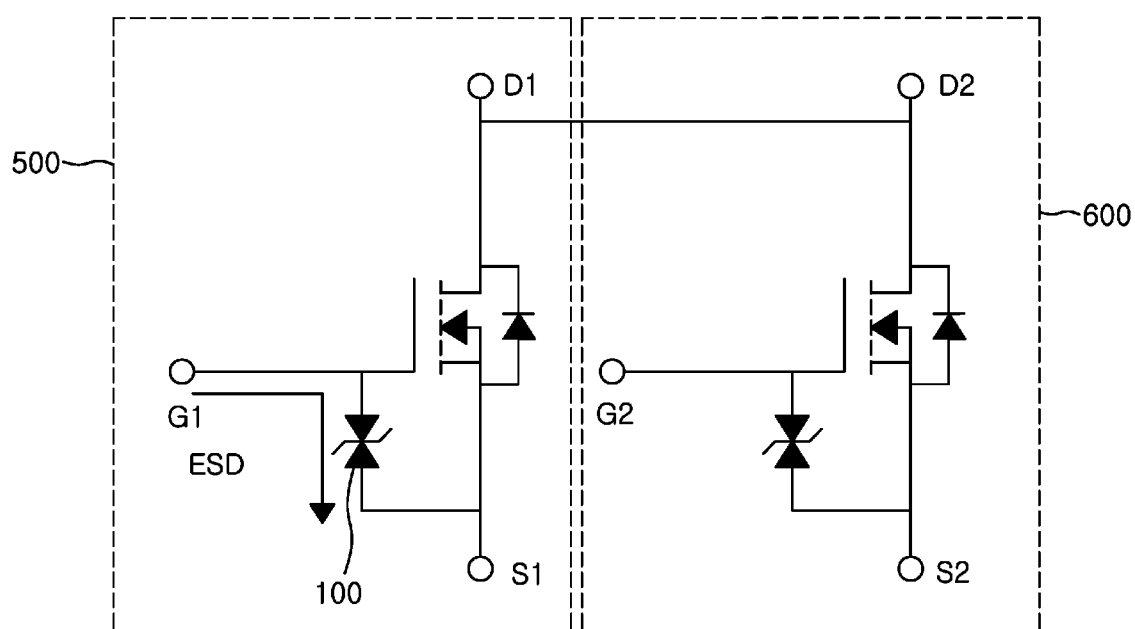
FIG. 11 is a circuit diagram of a power semiconductor device including a Zener diode according to an example.

FIG. 11 is a circuit diagram of a power semiconductor device including a Zener diode according to an example.

The power semiconductor chip 700 according to the example of FIG. 11 is composed of first and second power semiconductor elements 500, 600. Source electrodes S1 and S2, drain electrodes D1 and D2, and gate electrodes G1 and G2 are present in each of the power semiconductor devices 500, 600. The gate electrodes G1 and G2 are separated from each other, but the drain electrodes D1 and D2 are connected to each other. Also, the Zener diode 100 is arranged between the gate electrode G1 and the source electrode S1. In the example of FIG. 11, the gate electrodes G1, G2 may be seen as being a gate pad 300. The Zener diode 100 is electrically connected to the gate pad 300 and the source electrode 200. Therefore, when ESD stress flows into the gate pads G1, G2, due to the operation of the Zener diode 100, the stress is not introduced in the gate electrode 50 of the trench but is instead designed to discharge to the source electrodes S1, S2, 300. In this way, the internal circuit, namely, the trench MOSFET, is protected.

Figure 12:
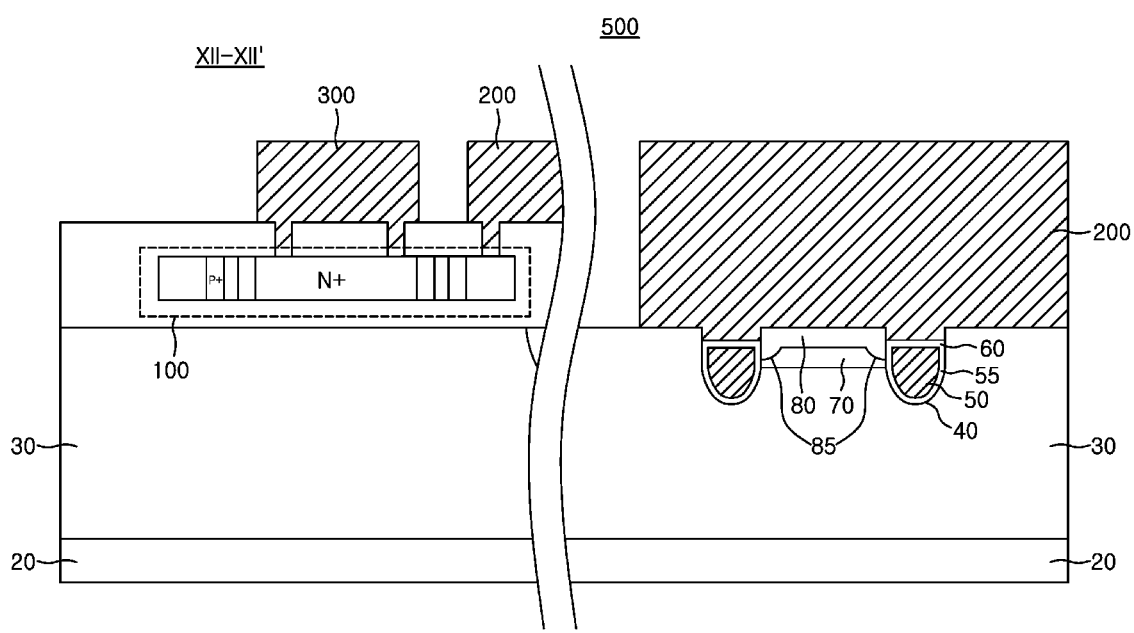
FIG. 12 is a cross-sectional view of a power semiconductor device including a Zener diode according to an example taken along the line XII-XII' in FIG. 1A.

FIG. 12 is a cross-sectional view of a power semiconductor device including a Zener diode according to an example taken along the line XII-XII' of FIG. 1A.

As illustrated in the example of FIG. 12, the power semiconductor device 500 includes a drain region 20, an N-epitaxial layer 30, a P body region 70, a gate electrode 50, and insulating layer 60, N+ source regions 80, 85 that are alternately formed, and a P+ body contact region 90.

Also, as explained further above, the power semiconductor device 500 includes a Zener diode 100. The Zener diode 100 is electrically and physically connected to the gate pad 300 and the source electrode 200.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method for manufacturing a power semiconductor device, the method comprising:

forming a drift region of a first conductivity type in a substrate;
forming a trench in the drift region;
forming a gate insulating layer in the trench;
depositing a conductive material on the substrate;
forming a gate electrode in the trench;
forming a body region in the substrate;
forming a highly doped source region in a first portion of the body region by implanting a dopant of the first conductivity type into the first portion of the body region;
forming an insulating layer that covers the gate electrode;
etching the insulating layer to open the body region;
forming a highly doped body contact region in a second portion adjacent to the first portion of the body region by implanting a dopant of a second conductivity type into the second portion of the body region, wherein only one of the highly doped source and body contact regions is disposed between adjacent trenches in each portion of the body region, and the highly doped source and body contact regions are formed alternately in a longitudinal direction of the trench; and
forming a source electrode on the highly doped body contact region and the highly doped source region,
wherein the highly doped source region comprises a first region formed on an upper surface of the body region and having a flat bottom surface, and a second region formed along a sidewall of the trench and having an inclined bottom surface overlapping the gate electrode.

2. The method for manufacturing a power semiconductor device of claim 1,
wherein each highly doped source and body contact region has a same width, and a length of the highly doped source region disposed between highly doped body contact regions is greater than a length of the highly doped body contact region disposed between highly doped source regions, and
wherein a top surface of the gate electrode is located at a position higher than half the depth of the trench.

3. The method for manufacturing a power semiconductor device of claim 1,
wherein a depth of the second region is greater than a depth of the first region relative to an upper surface of the substrate.

4. The method for manufacturing a power semiconductor device of claim 1,
wherein the depositing of the conductive material comprises depositing the conductive material on the gate insulating layer and a portion of the substrate, and
wherein the method further comprises forming a Zener diode in the conductive material deposited on the portion of the substrate.

5. The method for manufacturing a power semiconductor device of claim 4, wherein the forming of the Zener diode comprises:
implanting second conductivity type ions into the conductive material;
forming a mask pattern on the conductive material;
implanting first conductivity type ions into the conductive material through the mask pattern; and
removing the mask pattern.

6. The method for manufacturing a power semiconductor device of claim 4, further comprising forming a thick oxide layer on the portion of the substrate,
wherein the depositing of the conductive material comprises depositing the conductive material on the gate insulating layer and the thick oxide layer, and wherein the forming of the Zener diode comprises forming the Zener diode in the conductive material deposited on the thick oxide layer.

7. The method for manufacturing a power semiconductor device of claim 4, further comprising forming a gate pad connected to the gate electrode, wherein the Zener diode is connected to the gate pad and the source electrode, respectively.

8. The method for manufacturing a power semiconductor device of claim 4, wherein the Zener diode comprises a plurality of rings depending on a breakdown voltage of the power semiconductor device.

9. The method for manufacturing a power semiconductor device of claim 1, wherein the substrate comprises a drain region, and wherein the drift region is an epi-layer doped with a lower concentration than the drain region.

10. The method for manufacturing a power semiconductor device of claim 1, wherein an area of the highly doped source region is larger than an area of the highly doped body contact region.

\* \* \* \* \*